United States Patent [19]

Akama et al.

[11] Patent Number: 4,914,312
[45] Date of Patent: Apr. 3, 1990

[54] PULSED POWER SUPPLY FOR DETERMINING BREAKDOWN VOLTAGE

[75] Inventors: Hideo Akama, Hachiojishi; Norio Sone, Tachikawashi; Masaharu Goto, Tachikawa, all of Japan

[73] Assignee: Hewlett-Packard Company, Palo Alto, Calif.

[21] Appl. No.: 309,755

[22] Filed: Feb. 10, 1989

[30] Foreign Application Priority Data

Dec. 2, 1988 [JP] Japan .................................. 63-30215

[51] Int. Cl.$^4$ ............................................. H02J 3/00
[52] U.S. Cl. ........................................ 307/5; 307/75; 307/77
[58] Field of Search ............... 307/5, 75, 77; 323/270, 323/274, 275, 280, 284, 285; 363/65, 71

[56] References Cited

U.S. PATENT DOCUMENTS

| 3,470,457 | 9/1969 | Howlett | 323/280 |
| 4,517,472 | 5/1985 | Ruitberg et al. | 363/71 |

FOREIGN PATENT DOCUMENTS 148506 9/1983 Japan .

Primary Examiner—Patrick R. Salce
Assistant Examiner—Jeffrey Sterrett
Attorney, Agent, or Firm—Richard F. Schuette

[57] ABSTRACT

An apparatus for producing a high voltage comprising a high voltage output means operating on a system common voltage, and a floating power supply means operating on the output voltage from the high voltage output means which is at a floating common potential.

2 Claims, 6 Drawing Sheets

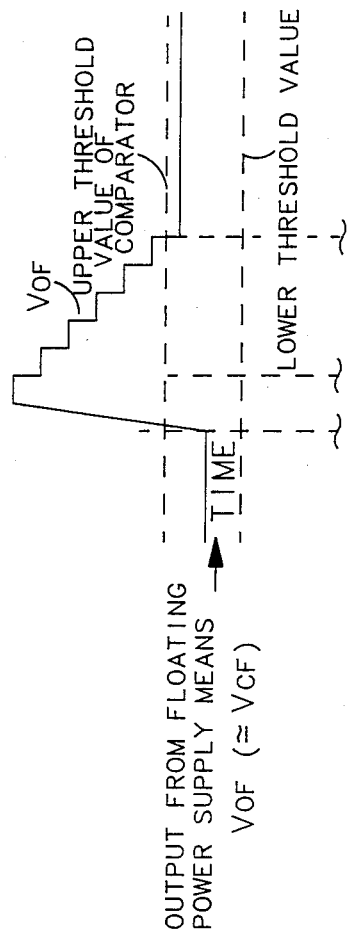
FIG 2A
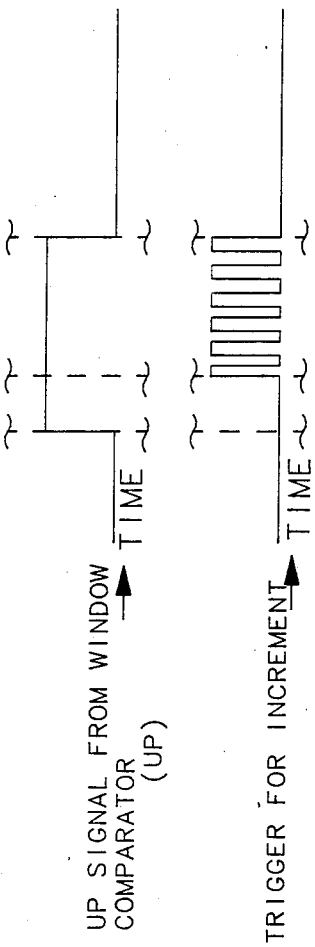
FIG 2B
FIG 2C
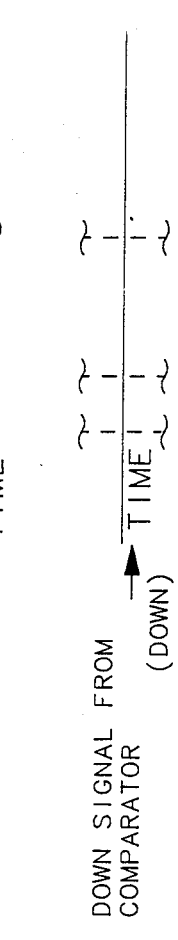
FIG 2D

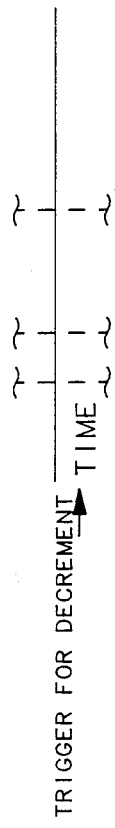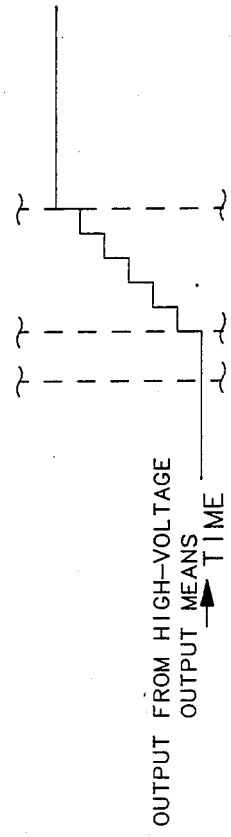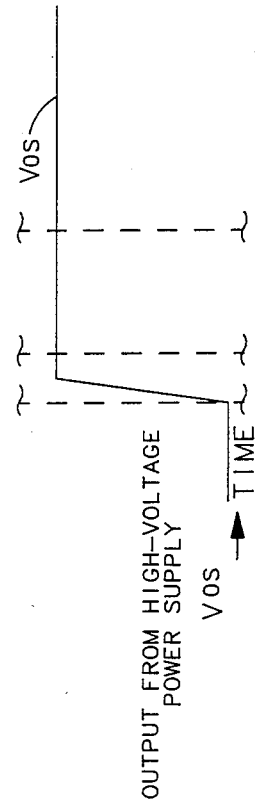

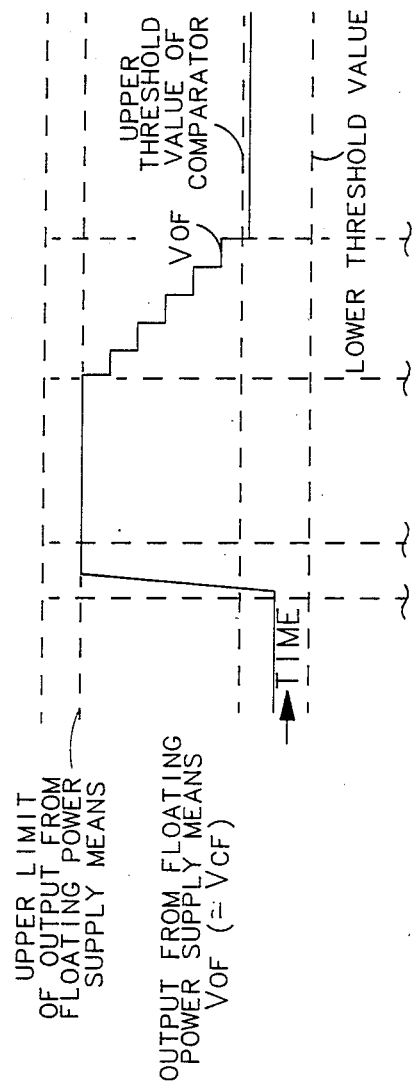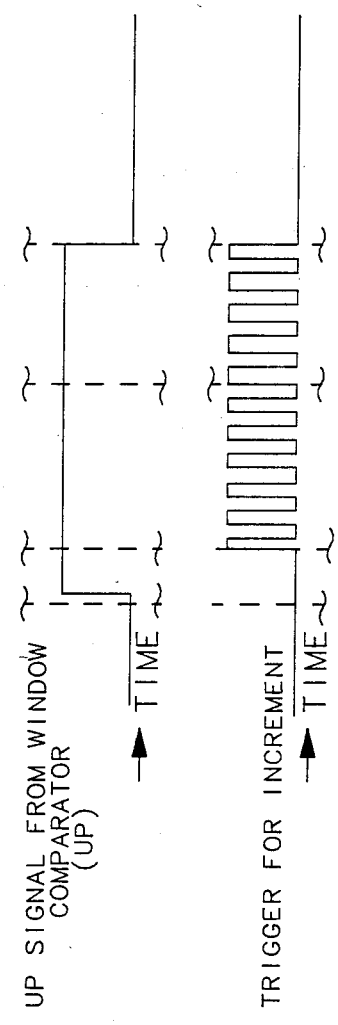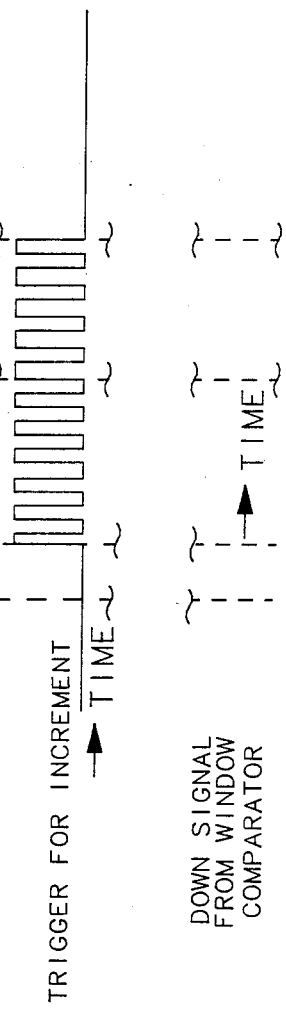

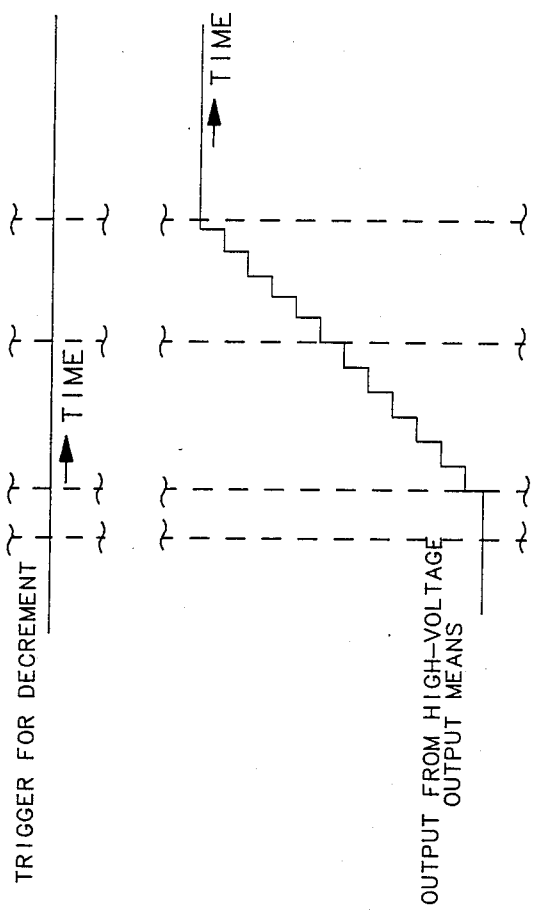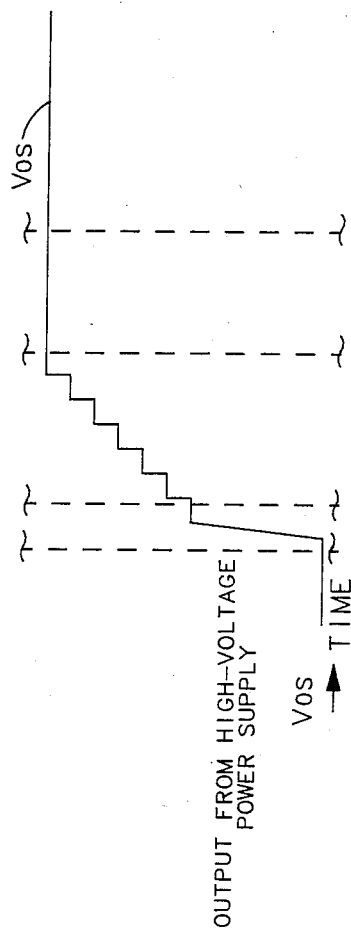

PULSED POWER SUPPLY FOR DETERMINING BREAKDOWN VOLTAGE

BACKGROUND OF THE INVENTION

The present invention relates generally to an apparatus for measuring the characteristics of semiconductor devices and, more particularly, to a high-voltage power supply capable of outputting a high voltage adequate to measure high breakdown voltages.

The breakdown voltage of a semiconductor diode or other device has been heretofore measured as follows. A reverse voltage is applied to the device, and the value of the voltage is varied. The reverse voltage measured when the electric current induced by the breakdown reaches a predetermined value is defined as its breakdown voltage. During this measurement, if the voltage is applied for a long time, heat generated inside the device may destroy the device itself. Therefore, the applied voltage is required to take the form of pulses, for example high-speed pulses having a pulse duration of about 1 ms. If such pulses have a pulse height of tens of volts, then they can be easily produced. However, when a device whose breakdown voltage is as high as 1 KV, for example, undergoes measurement, it is not easy to produce high-speed pulses necessary for the measurement.

One conceivable method of producing pulses of such a high voltage is to control a switching regulator by analog feedback. Another conceivable method consists in stepping up an AC voltage by a transformer and controlling the AC voltage by a sliding transformer. However, none of these methods offer satisfactory voltage response speeds or frequency response characteristics. In a system where a linear amplifier comprising transistors resistant to high voltages is controlled by analog feedback, a large amount of idling current is necessary to provide rapid response. Consequently, a large amount of electric power is consumed.

SUMMARY OF THE INVENTION

The present invention is based on the fact that a voltage applied to a device to measure the breakdown voltage is required to take the form of high-speed pulses which vary within a range of tens of volts, and that the voltage need not be high-speed pulses outside the range. Specifically, in the breakdown region, there is the possibility of destruction of the device because of generation of heat and, therefore, the voltage is required to assume the form of high-speed pulses. Measurement has shown that a slight change in the applied voltage greatly changes the electric current in this region and that a voltage of tens of volts suffices as the maximum pulse height of the variable output in many applications (see FIG. 4).

A high-voltage power supply according to the invention comprises a high-voltage output means operating on a system common voltage and a floating power supply means operating on the output voltage from the high-voltage output means which is at a floating common potential. The high-voltage output means is capable of producing high voltages, say higher than about 1 KV, but great rapidity is not necessary for it. The floating power supply means delivers output up to about more than ten volts, but it responds quickly. For instance, it can produce pulses having a duration of 1 ms. The output from the high-voltage power supply which operates on the system common voltage is set by an output-setting means located in the floating power supply means. After the output has been set to a desired value by the output-setting means, the output from the floating power supply means varies according to the set value at the response speed of the power supply means itself. The output from the floating power supply means is compared with given values by a comparator which is placed at the floating common potential. The output from the comparator is fed via isolator means to the high-voltage output means that is at the system common potential. The output from the high-voltage output means, i.e., the floating common potential, is increased or decreased according to the input signal. Meanwhile, the floating common potential is added to or subtracted from the system common potential by an adder means. Then, the resulting potential is added to or subtracted from the output from the output-setting means to increase or decrease the output from the floating power supply means. The output from the high-voltage output means increases or decreases in a direction opposite to the direction in which the output from the floating power supply means increases or decreases. In this way, the output voltage from the high-voltage output means is so controlled that it lies within a range to permit the floating power supply to operate.

Thus, a high-voltage power supply which can produce high-speed pulses especially adapted for measurement of high breakdown voltages of devices and which consumes only a small amount of electric power and operates at high frequencies can be fabricated economically. The floating power supply means can measure the output current into the device when breakdown occurs.

The high-voltage output means and the floating power supply means may be controlled separately, and simple sum of the these outputs may be used as the output from the high-voltage power supply.

It is an object of the present invention to provide an inexpensive apparatus which can produce a high voltage exceeding 1 KV, consumes only a small amount of electric power, i.e., has a high efficiency, and operates at high frequencies.

BRIEF DESCRIPTION OF THE DRAWINGS

FIGS. 2A-2G are a diagram illustrating the operation of the apparatus shown in FIG. 1 when a low voltage is produced;

FIGS. 3A-3F are a diagram illustrating the operation of the apparatus shown in FIG. 1 when a high voltage is produced.

DETAILED DESCRIPTION OF THE PREFERRED EMBODIMENT

Figure 1:
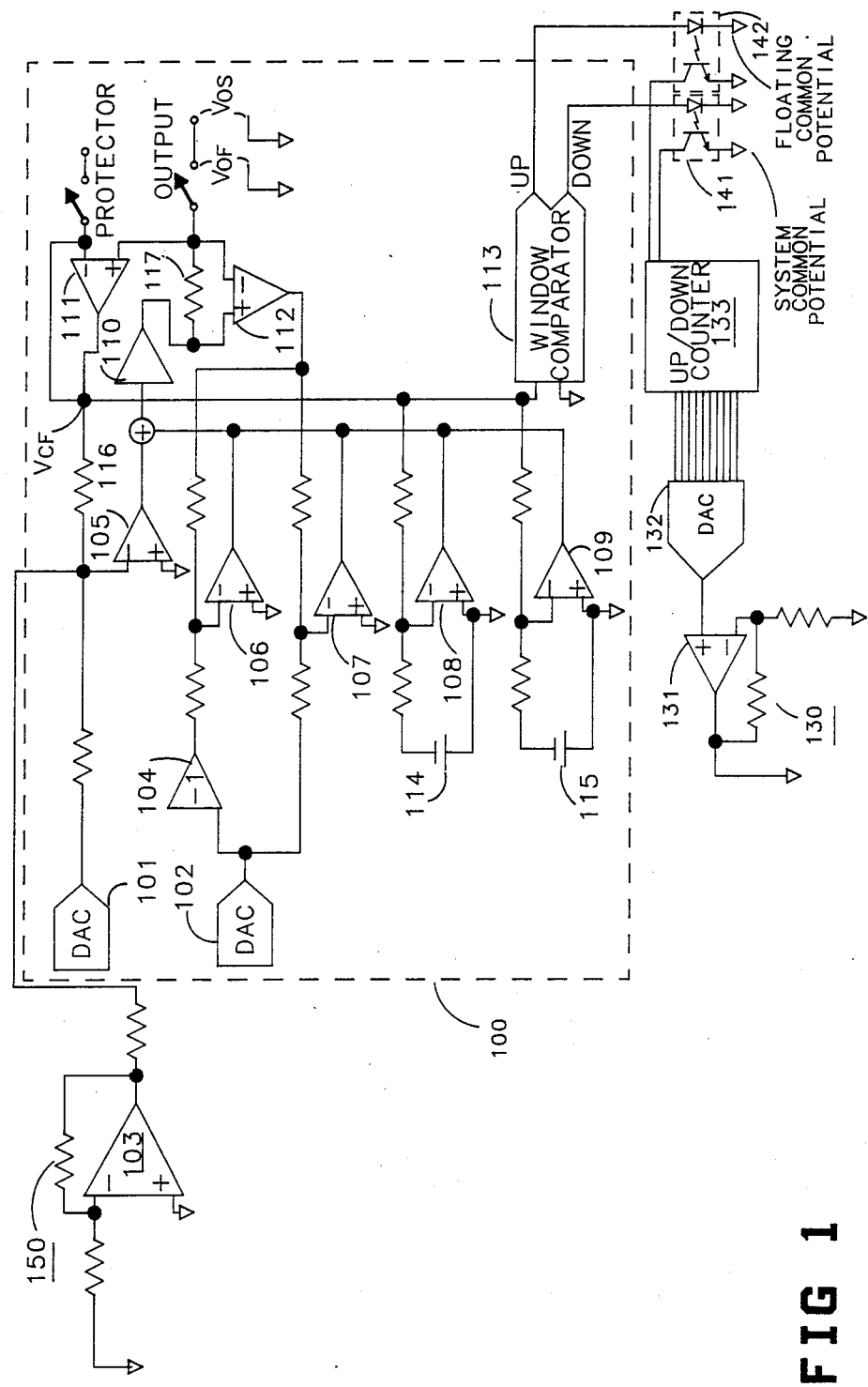
FIG. 1 is a diagram illustrating an apparatus according to the invention.
Figure 4:
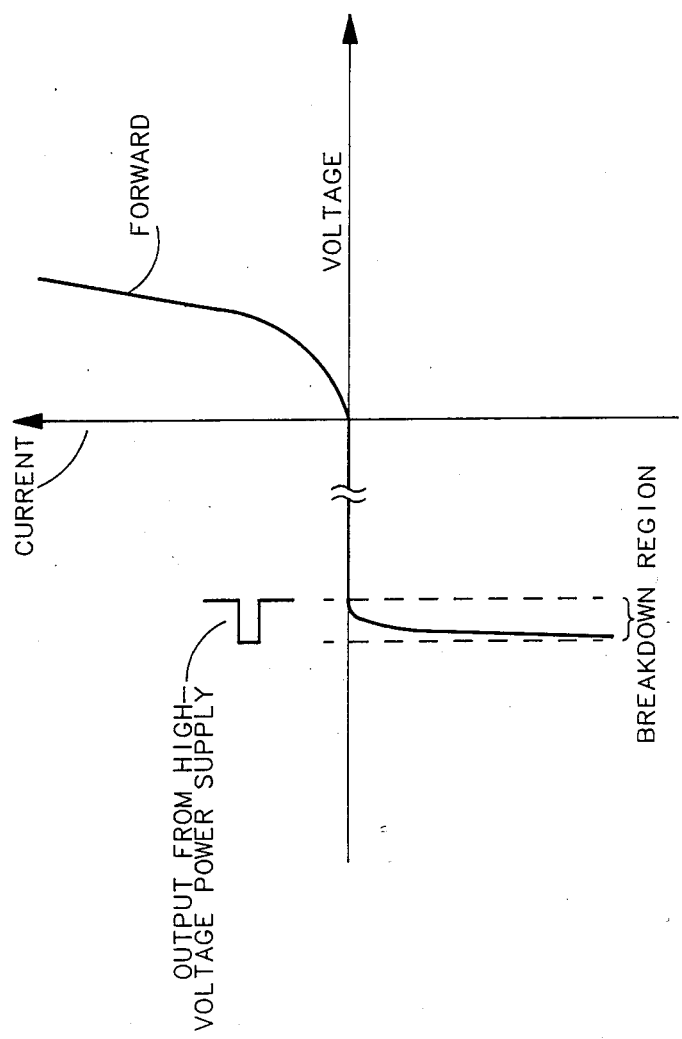
FIG. 4 is a graph showing the breakdown characteristic of a diode.

Referring to FIG. 1, there is shown a high-voltage power supply according to the invention. This power supply includes a high-voltage output means 130. When this circuit operates in voltage mode, the high-voltage power supply delivers an output voltage $V_{os}$ with respect to the system common voltage. This output voltage is set by a DAC 101. At this time, a loop comprising an amplifier 105, a coupling circuit 116, another amplifier 110, a resistor 117 used for detection of current, and a further amplifier 111 operates to set $V_{os}$ to a desired value. A DAC 102 acts to set either the current flowing through the resistor 117 or the limit of the current. The positive current is set or limited under the control of an amplifier 106. The negative current is set or limited under the control of an amplifier 107. The operation of these devices is described in detail in, for example, Japanese patent laid-open No. 148506/1983, entitled "Composite Control Amplifier". When the voltage $V_{cf}$ at the illustrated point which is equal to the output $V_{of}$ from the floating power supply means is about to vary in a positive or negative direction beyond the range of the output voltage from the floating power supply means 100, an amplifier 108 or 109 limits the operation of the floating power supply means 100 to prevent spike noise from appearing at the output.

The operation of the high-voltage power supply when the output voltage from the floating power supply means 100 lies within the acceptable range is next described in referring to FIG. 2. When the DAC 101 sets $V_{os}$ to a positive value, for example, the output $V_{of}$ from the floating power supply means with respect to the floating common potential rises precipitously at the response speed of the floating power supply means itself. At this time, $V_{cf}$ is compared with floating common potentials +0.6 V or −0.6 V, for example, by a window comparator 113 placed at the floating common potentials. In this case, the comparator 113 produces an UP signal or DOWN signal which is supplied to an UP/DOWN counter 133 that is put at the system common potential, through a photocoupler 142 or 141 acting to isolate the common potential. The counter 133 receives this signal every period, say of 20 μs, and increments. The output from the counter 133 is applied to a DAC 132. The output from the DAC 132 is applied to an amplifier 131 included in a high-voltage output means 130 to increase the output from the amplifier 131, i.e., the floating common potential is increased. Meanwhile, an amplifier 103 included in an adder means 150 produces the difference between the floating common potential and the system common potential. The output from the amplifier 103 is connected to the inverting input terminal of the amplifier 105. Since the output from the DAC 101 is reduced, $V_{of}$ decreases. This series of operations is repeated until $V_{cf}$ falls within the window, or the limits, of the comparator 113. As a result, the waveform of $V_{os}$ rises precipitously at the response speed of the floating power supply means 100 itself. Similarly, the waveform drops at a high speed. When the value set by the DAC 101 is negative, the comparator 113 produces a DOWN signal. In this case, the process is opposite to the process performed when a positive value is set.

FIG. 3 is a diagram illustrating the operation of the high-voltage power supply when the output voltage $V_{of}$ from the floating power supply means 100 lies outside the allowed range. While $V_{of}$ is going in a positive direction almost beyond the range, the value of $V_{of}$ is suppressed within the range by the amplifier 108. The other operations are similar to the operations described already in connection with FIG. 2. After rising precipitously as shown, $V_{os}$ has a staircase portion.

The high-voltage output means is controlled by a digital signal, thus yielding the following advantages:

(1) The frequency response of the high-voltage output means does not participate in the stability of the system. It is only required that the high-voltage output means can respond to the staircase waveform which varies periodically and is offered by the UP/DOWN counter and the DAC. The stability of the system is not affected whatever operation is internally performed on the band, such as peaking. Also, any arbitrary circuit configuration can be adopted. For example, a switching regulator which has high efficiency and consumes a small amount of electric power can be used.

(2) The hardware of the control system is simpler and smaller than the hardware used to control a high voltage by an analog signal. When feedback is provided to the high-voltage output means using an analog signal, a transformer, an analog photo-isolator, etc. are needed.

(3) Since the high-voltage output means is comparatively independent of the floating power supply means and so a large degree of freedom is given to the design.

It is to be understood that the output from the window comparator 113 is not limited to the two signals, or UP and DOWN signals. Also, it is not always necessary that the UP/DOWN counter 113 accept these signals at regular intervals.

As described thus far, the present invention provides an inexpensive high-voltage power supply which can especially measure high breakdown voltages of semiconductor devices rapidly and accurately without destroying the devices and which consumes a small mount of electric power and operates in a wide band.

We claim:

1. A voltage source comprising:
   a slowly variable voltage supply,
   a rapidly variable voltage supply coupled in series with said slowly variable supply, and
   means responsive to a signal from said rapidly variable supply for changing the voltage provided by said slowly variable supply in a direction opposite to a change in voltage provided by said rapidly variable supply.

2. A voltage source comprising:
   a slowly variable voltage supply for providing a voltage of a given magnitude,
   a rapidly variable floating voltage supply coupled in series with said slowly variable supply,
   means for controlling said rapidly variable voltage supply so that its voltage changes rapidly in a given direction through a range of voltage that is less than said magnitude,
   means responsive to the voltage supplied by said rapidly variable supply reaching the end of said range for slowly changing its voltage in the opposite direction and the voltage provided by said slowly variable supply in said given direction, and
   means responsive to a current drawn through said rapidly variable supply while its voltage is changing through said range for reducing the voltage it supplies.

* * * * *